United States Patent [19]

Ienaka et al.

[11] 4,139,738
[45] Feb. 13, 1979

[54] MULTIPLEX DECODER HAVING A DISTORTION-FREE DIFFERENTIAL AMPLIFIER

[75] Inventors: Masanori Ienaka, Kodaira; Yasuo Kominami, Kokubunji, both of Japan

[73] Assignee: Hitachi, Ltd., Japan

[21] Appl. No.: 831,520

[22] Filed: Sep. 8, 1977

[30] Foreign Application Priority Data

Sep. 13, 1976 [JP] Japan .................. 51-108792

[51] Int. Cl.² ............................................. H04R 5/00
[52] U.S. Cl. .................. 179/15 BT; 329/50; 330/85
[58] Field of Search ............... 179/15 BT; 325/36, 48; 329/50, 167; 330/85

[56] References Cited

U.S. PATENT DOCUMENTS

| 3,546,612 | 12/1970 | Day | 330/85 |
|---|---|---|---|
| 3,721,766 | 3/1973 | Hilbert | 179/15 BT |
| 3,842,211 | 10/1974 | Metro | 179/15 BT |
| 3,947,645 | 3/1976 | Mizukami et al. | 179/15 BT |
| 4,054,839 | 10/1977 | Ohsawa | 179/15 BT |

Primary Examiner—Douglas W. Olms
Attorney, Agent, or Firm—Craig & Antonelli

[57] ABSTRACT

In a multiplex decoder circuit comprising two pairs of transistor differential circuits driven by switching signals of a 38 kHz subcarrier signal, for separating a stereo composite signal into left and right channel signals, a differential amplifier formed of a pair of transistors connected to the respective differential circuits for amplifying and injecting the composite signal, and a constant current source, at least one of the pair of differential transistor amplifiers being supplied with the composite signal is formed of a negative feedback amplifier to suppress the output distortion of the transistor amplifier due to variations in the emitter resistance of the transistor amplifier with respect to the variations of the input stereo composite signal. As a result, the waveform distortion of the separated left and right channel signals is reduced.

5 Claims, 4 Drawing Figures

F I G. 1
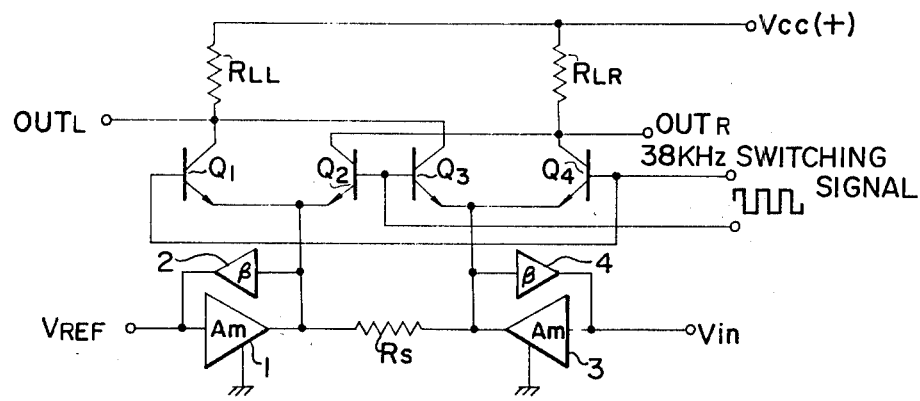
F I G. 2
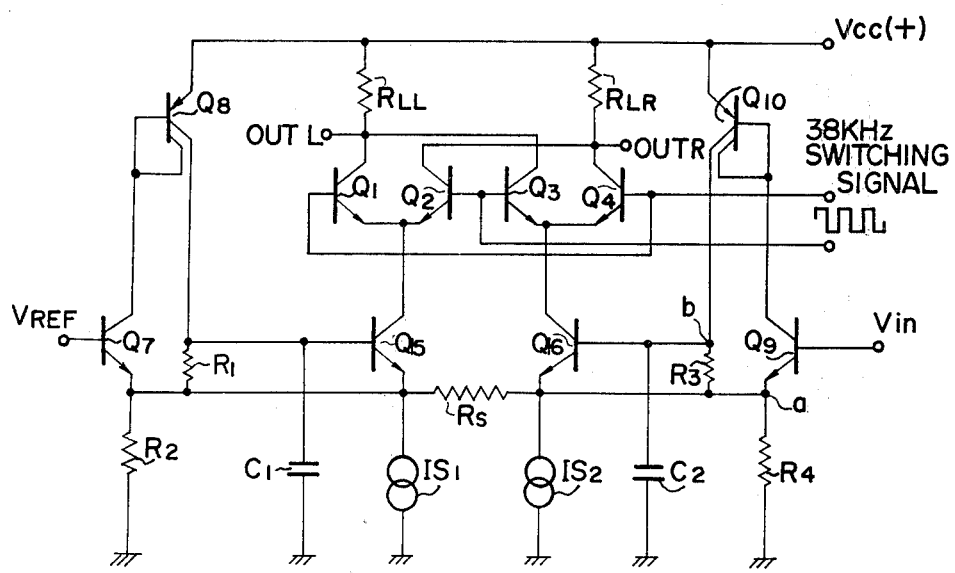

MULTIPLEX DECODER HAVING A DISTORTION-FREE DIFFERENTIAL AMPLIFIER

BACKGROUND OF THE INVENTION

1. Field of the Invention

This invention relates to a multiplex decoder circuit, and more particularly to a multiplex decoder circuit formed of a distortion-free, double-balanced differential amplifier.

2. Description of the Prior Art

A full-wave coincidence type time division circuit utilizing a double-balanced differential amplifier circuit as shown in FIG. 3 was proposed as a multiplex decoder in FM stereo broadcast receivers. See, for example, demodulators described in U.S. Pat. No. 3,573,382 to J. H. Feit, assigned to Motorola Inc. In such multiplex decoders, however, the occurrence of waveform distortion has been the problem. Such a waveform distortion is considered to arise mainly in differential pair transistors $Q_5$ and $Q_6$ to the bases of which a stereo composite signal is applied, the transistors $Q_5$ and $Q_6$ constituting a so-called signal-injection type amplifier. In the reception of stereo broadcasts, other differential pair transistors $Q_1$, $Q_2$, $Q_3$ and $Q_4$, supplied with a switching signal of a subcarrier signal, serve as the respective switching elements. More particularly, the bases of the transistors $Q_1$ and $Q_4$ are supplied with the same 38 kHz subcarrier but 180 degrees out of phase with that applied to the bases of the transistors $Q_2$ and $Q_3$. Further, the collectors of the transistors $Q_1$ and $Q_3$ and those of the transistors $Q_2$ and $Q_4$ are coupled to each other, respectively and then connected to a supply voltage $+V_{cc}$ through respective load resistors $R_{LL}$ and $R_{LR}$. Then, the demodulated, stereophonically related left and right channel signals are derived from output terminals OUT L and OUT R connected to the interconnection points of the collectors and the load resistors. The differential pair transistors $Q_1$, $Q_2$, $Q_3$ and $Q_4$ are switched between the two extreme states; almost zero impedance in the turned-on state and almost infinite impedance in the turned-off state. Thus, there is very little possibility of causing waveform distortion therein. On the other hand, the transistors $Q_5$ and $Q_6$ are operated in the intermediate region, i.e., in the active region of their performance characteristics and hence there is a large possibility of causing waveform distortion.

Detailed analysis of the phenomenon revealed the following causes of waveform distortion.

The emitter resistance re of each of the transistors $Q_5$ and $Q_6$ is not always constant but is dependent on the emitter current. More particularly, the emitter resistance re and the emitter current IE are in an exponential relation as shown in FIG. 4. Therefore, when a reference point is taken at a small emitter current IE2 by selecting a low base bias voltage, the variation in the emitter resistance re2 with respect to the variation of an A.C. signal iE becomes large. This is a reason for the change in the amplification factor of the transistor with the variation of the input signal and directly leads to waveform distortion. For decreasing such waveform distortion, the biasing point may be shifted to a point IE1 around which the variation Δre1 of the emitter resistance re is small, i.e., the base bias voltage is high and the emitter current is large. At the present stage, the base bias voltage should be set around 8 to 9 volts for suppressing the waveform distortion below 0.01%, thus requiring a very high supply voltage $+V_{cc}$, e.g., 30 volts. In case of using a relatively low supply voltage $+V_{cc}$ such as 12 volts, such a high base bias voltage, however, is practically unachievable since the output voltage is limited by the supply voltage $+V_{cc}$.

SUMMARY OF THE INVENTION

Therefore, one object of this invention is to reduce the distortion of the output waveform of a multiplex decoder.

Another object of this invention is to provide a multiplex decoder capable of reducing the distortion of the output waveform of signal-injecting, differential pair transistors connected in series with the differential pair transistors of switching action.

A further object of this invention is to provide a multiplex decoder comprising signal-injecting, differential pair transistors, each having a negative feedback loop with a relatively small number of constituent parts, and capable of reducing waveform distortion without having to set the base bias voltage of the transistor or the supply voltage high.

Another object of this invention is to provide a multiplex decoder provided with a reduced distortion differential amplifier, and capable of being fabiricated in the form of a monolithic IC.

According to an aspect of this invention, there is provided a multiplex decoder comprising two pairs of differential circuits including four transistors and driven by signals for switching the left and right channels and a pair of signal-injection type amplifiers connected to the respective differential circuits, at least one of the signal-injection type amplifiers which is supplied with a stereo composite signal is a negative feedback amplifier.

Other objects, features and advantages of this invention will become apparent from the following detailed description of the preferred embodiments of this invention when taken in conjunction with the accompanying drawings.

BRIEF DESCRIPTION OF THE DRAWINGS

FIG. 1 is a circuit diagram showing the basic construction of the multiplex decoder of this invention.

FIG. 2 is a circuit diagram of a multiplex decoder showing an embodiment of this invention.

DESCRIPTION OF THE PREFERRED EMBODIMENTS

Figure 3:
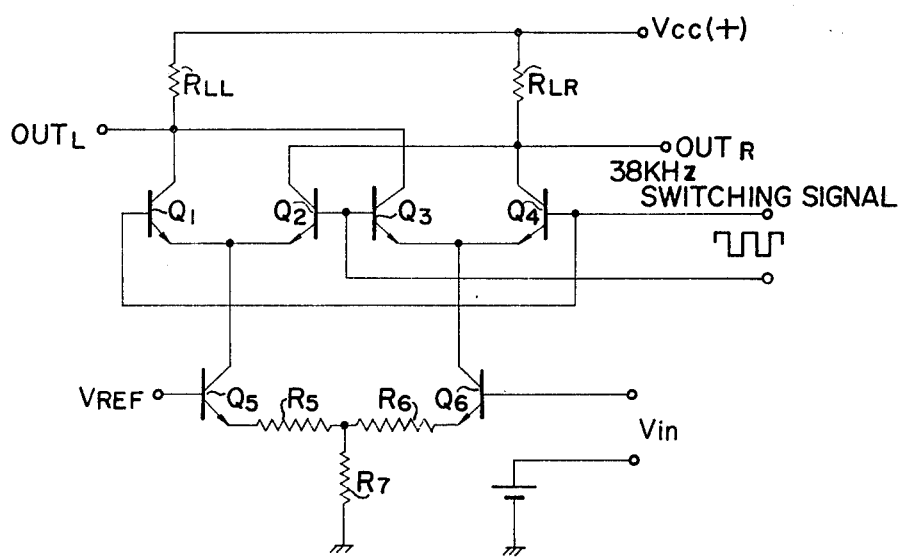
FIG. 3 is a circuit diagram of a multiplex decoder utilizing differential amplifiers of conventional techniques.

Hereinbelow, description will be made of the preferred embodiments of this invention. In the figures, similar reference numerals denote similar parts.

FIG. 1 is a circuit diagram of the basic construction of this invention and FIG. 2 is a circuit diagram of a concrete embodiment of the basic construction shown in FIG. 1.

In FIGS. 1 and 2, $Q_1$, $Q_2$, $Q_3$ and $Q_4$ are left and right channel switching transistors constituting a double-balanced differential amplifier and driven by 38 kHz switching signals 180 degrees out of phase with each other which are applied to the bases of transistors $Q_1$ and $Q_4$ and to those of transistors $Q_2$ and $Q_3$. A signal-injecting amplifier 1 for amplifying the reference bias signal Vref is provided with a negative feed-back circuit 2, while the other signal-injecting amplifier 3 for amplifying an input signal Vin such as a stereo composite signal is provided with a negative feed-back circuit 4. A left channel load resistor $R_{LL}$ and a right channel load resistor $R_{LR}$ are both connected to a supply voltage source $+V_{cc}$. A resistor $R_s$ connects the amplifiers 1 and 3 in differential manner.

The resistor $R_s$ also serves as a resistor for separation control. The value of the resistor $R_s$ is selected to be such that the crosstalk signals appearing at the collectors of the transistors $Q_1$ and $Q_4$ are cancelled by the out-of-phase attenuated signals crossfed through the resistor $R_s$, with the degree of attenuation being determined by the relative values of the resistor $R_s$ and the output impedance of the respective amplifiers 1 and 3.

According to this invention, since both the input signal and the reference bias signal are applied to the decoder circuit through negative feedback amplifiers, each of which is formed of an amplifier $A_m$ and a negative feedback circuit $\beta$, waveform distortion can be reduced.

The reason for the reduction of waveform distortion by the negative feedback amplification is as follows.

Let the total harmonic distortion first generated at the output of the amplifier $A_m$ in case of not providing the negative feedback be D and the resultant distortion through the negative feedback be $D_f$, the following equation holds;

$$D_f = D - \beta D_f A$$

where, A is the gain of the signal-injecting amplifier when no negative feed-back is provided thereto and $\beta$ is the feed-back rate in the feed-back circuit. The above equation can be rewritten as $$D_f = D/(1 + \beta A)$$

This means that the distortion is reduced to $1/(1 + \beta A)$, for example 1/100, through the negative feed-back. Thus, the distortion can be reduced to a minimal amount.

FIG. 2 shows a circuit construction embodying the above principle of this invention. The amplifier 3 comprises an npn-type first stage transistor $Q_9$ of emitter follower connection, a multi-collector pnp-type second stage transistor $Q_{10}$ connected in diode connection between the collector of the transistor $Q_9$ and the supply voltage $+V_{cc}$, and an npn-type third stage transistor $Q_{16}$. A capacitor $C_2$ is connected between the base of the transistor $Q_{16}$ and ground to compensate the phase of the signal amplified by the amplifier 3 so as to prevent undesired oscillation therein. A resistor $R_3$ connected between the base and emitter of the transistor $Q_{16}$ allows the bias current through the other collector of the transistor $Q_{10}$ to increase to a large amount. Thus, the transistor $Q_{10}$ can be driven by a large amplitude of high frequency signals inputted to the base thereof. The feed-back circuit 4 consists of a conductive path connected between the emitters of the transistors $Q_{16}$ and $Q_9$. If the adjustment of the negative feed-back rate is desired, an adjusting resistor may be inserted between those emitters which serves as the conductive path. The emitter of the npn-type amplifier transistor $Q_{16}$ is connected to a constant current source $IS_2$. Similarly the amplifier 1 comprises transistors $Q_{15}$, $Q_7$ and $Q_8$. The feed-back circuit 2 similarly consists of a conductive path connected between the emitters of the transistors $Q_{15}$ and $Q_7$. The emitter of the amplifier transistor $Q_{15}$ is connected to a constant current source $IS_1$. Description will be made as to how the reference bias signal Vref and the stereo composite signal Vin are subjected to negative feed-back amplification.

Figure 4:
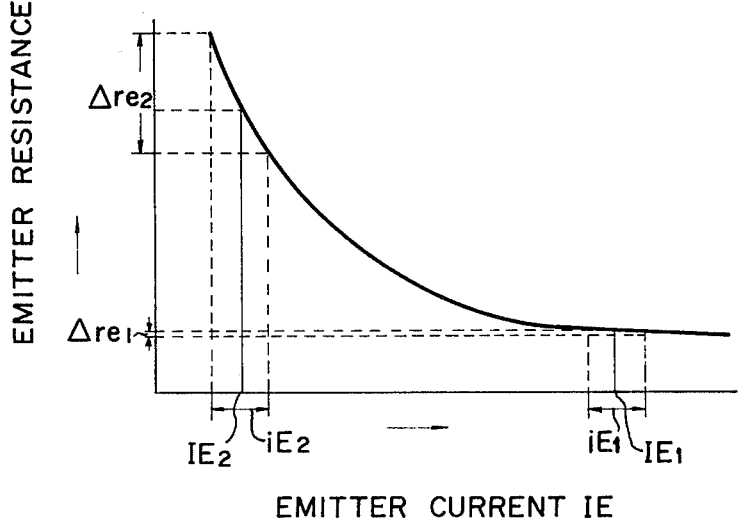
FIG. 4 is a graph showing the relation between the emitter resistance and the emitter current of a transistor.

When the stereo composite signal Vin rises above a certain reference level, the collector current of the transistor $Q_9$ increases. Then, the collector current through the other collector (node b) of the transistor $Q_{10}$ also increases to raise the voltage level at the emitter of the transistor $Q_{16}$. Accordingly, since the raised emitter voltage level is fed back to the emitter (node a) of the transistor $Q_9$ through the conductive path between the emitters of the transistors $Q_{16}$ and $Q_9$, the base-to-emitter bias of the transistor $Q_9$ decreases to decrease the collector current thereof. Thus, the relative voltage difference between the base and the emitter of the injection amplifier transistor $Q_9$ increases little. The emitter bias current of the transistor $Q_{16}$ can be set at a low value, e.g., the point IE2 shown in FIG. 4.

As stated above, according to this invention, the waveform distortion can be suppressed small by the use of the negative feed-back amplification.

What is claimed is:

1. A multiplex decoder circuit comprising:

one pair of differential circuits for generating spearated left and right channel signals from a stereo composite signal, wherein one of said one pair of differential circuits comprises first and second transistors, the other of said one pair of differential amplifiers comprises third and fourth transistors, the emitters of said first and second transistors being connected to each other, the emitters of said third and fourth transistors being connected to each other, the bases of said first and fourth transistors and the bases of said third and fourth transistors being driven by channel switching signals in opposite-phase respectively, the collectors of said first and third transistors being respectively connected to a left channel load resistor, and the collectors of said second and fourth transistors being connected to a right channel load resistor;

a first amplifier having a negative feedback function, said first amplifier having an output terminal connected to said emitters of said first and second transistors, and an input terminal supplied with a reference signal;

a second amplifier having a negative feedback function, said second amplifier having an output terminal connected to said emitters of said third and fourth transistors, and an input terminal supplied with a stereo composite signal; and a separation control resistor for cancelling crosstalk signals coupled between said first and second amplifiers.

2. A multiplex decoder circuit according to claim 1, wherein said first amplifier comprises:

a fifth transistor of the same conductivity type as said first and second transistors, having a collector connected to said emitters of said first and second transistors and an emitter connected to one end of said separation control resistor;

a sixth transistor of the same conductivity type as that of said fifth transistor, having a base supplied with said reference signal;

a seventh transistor of a different conductivity type than that of said sixth transistor, having a first collector and a base of which are connected to the collector of said sixth transistor, an emitter connected to a supply voltage, and a second collector connected to the base of said fifth transistor; and first means connected between the emitters of said fifth and sixth transistors for feeding back the emitter voltage appearing at said emitter of said fifth transistor to said emitter of said sixth transistor, and wherein said second amplifier comprises:

an eighth transistor of the same conductivity type as said third and fourth transistors, having a collector connected to said emitters of said third and fourth transistors and an emitter connected to another end of said separation control resistor;

a ninth transistor of the same conductivity type as that of said eighth transistor, having a base supplied with said stereo composite signal;

a tenth transistor of a different conductivity type than that of said ninth transistor, having a first collector and a base of which are connected to the collector of said ninth transistor, an emitter connected to said supply voltage, and a second collector connected to the base of said eighth transistor; and second means connected between the emitters of said eighth and ninth transistor for feeding back the emitter voltage appearing at said emitter of said eighth transistor to said emitter of said ninth transistor.

3. A multiplex decoder circuit according to claim 1, wherein said channel switching signal is a 38 KHz subcarrier signal.

4. A multiplex decoder circuit according to claim 1, wherein said first and second amplifiers are differentially coupled through said separation control resistor and respectively connected to respective constant current source circuits.

5. A multiplex decoder circuit comprising:

first, second, third, and fourth switching transistors each driven by 38 KHz channel switching signals, for separating a stereo composite signal into stereophonically related left and right channel signals, wherein the collectors of said first and third switching transistors are respectively connected to a left channel load resistor, and the collectors of said second and fourth transistors are connected to a right channel load resistor;

a fifth transistor of the same conductivity type as said first and second switching transistors, having a collector connected to said emitters of said first and second switching transistor;

a sixth transistor of the same conductivity type as that of said fifth transistor, having a collector connected to said emitters of said third and fourth transistor;

separation control resistive means coupled between the emitters of said fifth and sixth transistors:

a seventh transistor of the same conductivity type as that of said fifth transistor, having a base supplied with a reference bias;

an eighth transistor of a different conductivity type than that of said seventh transistor, having a first collector and a base connected to the collector of said seventh transistor, an emitter connected to a supply voltage, and a second collector connected to the base of said fifth transistor;

a ninth transistor of the same conductivity type as that of said sixth transistor, having a base supplied with said stereo composite signal;

a tenth transistor of the same conductivity type as said eighth transistor, having a first collector and a base of which are connected to the collector of said ninth transistor, an emitter connected to said supply voltage, and a second collector connected to the base of said sixth transistor;

first means for connecting between the emitters of said fifth and seventh transistors;

second means for connecting between the emitters of said sixth and ninth transistors;

a first capacitor connected between said base of said fifth transistor and ground; and a second capacitor connected between said base of said sixth transistor and ground.

* * * * *